(12) United States Patent
Muchow et al.

(10) Patent No.: US 9,739,998 B2
(45) Date of Patent: Aug. 22, 2017

(54) MICROMECHANICALLY ASSEMBLY, METHOD FOR MANUFACTURING A MICROMECHANICAL ASSEMBLY AND METHOD FOR OPERATING A MICROMECHANICAL ASSEMBLY

(71) Applicants: Joerg Muchow, Reutlingen (DE); Helmut Grutzeck, Kusterdingen (DE); Jochen Franz, Reutlingen (DE); Zoltan Lestyan, Martonvasar (HU)

(72) Inventors: Joerg Muchow, Reutlingen (DE); Helmut Grutzeck, Kusterdingen (DE); Jochen Franz, Reutlingen (DE); Zoltan Lestyan, Martonvasar (HU)

(73) Assignee: ROBERT BOSCH GMBH, Stuttgart (DE)

( * ) Notice: Subject to any disclaimer, the term of this patent is extended or adjusted under 35 U.S.C. 154(b) by 174 days.

(21) Appl. No.: 13/894,989

(22) Filed: May 15, 2013

(65) Prior Publication Data

US 2013/0308173 A1  Nov. 21, 2013

(30) Foreign Application Priority Data

May 15, 2012  (DE) ......................... 10 2012 208 117

(51) Int. Cl.
| | |
|---|---|
| G02B 26/00 | (2006.01) |
| G02B 26/08 | (2006.01) |
| G02B 26/10 | (2006.01) |
| B81B 3/00 | (2006.01) |

(52) U.S. Cl.
CPC ............ *G02B 26/00* (2013.01); *B81B 3/0021* (2013.01); *G02B 26/085* (2013.01);
(Continued)

(58) Field of Classification Search
CPC .... G02B 26/00; G02B 7/182; G02B 26/0825; G02B 26/0833; G02B 26/085;
(Continued)

(56) References Cited

U.S. PATENT DOCUMENTS 4,699,006 A * 10/1987 Boxenhorn ................ 73/514.15
8,344,831 B2   1/2013 Pinter et al.
(Continued)

FOREIGN PATENT DOCUMENTS

| CN | 1448333 A | 10/2003 | |
|---|---|---|---|
| DE | 10 2008 001 896 | 11/2009 | |
| JP | WO 2011061833 A1 * | 5/2011 | ........... B81B 3/0062 |

*Primary Examiner* — Bumsuk Won
*Assistant Examiner* — Ephrem Mebrahtu
(74) *Attorney, Agent, or Firm* — Norton Rose Fulbright US LLP; Gerard Messina (57) ABSTRACT

A micromechanical assembly having a holder, a drive frame which has at least one energizable coil device disposed at least one of on and in the drive frame and which is joined to the holder via at least one frame spring, a mirror element that is at least partially framed by the drive frame and is suspended from the drive frame by a first mirror spring and a second mirror spring, the mirror element being disposed between the two mirror springs and being adjustable about a mirror axis of rotation in relation to the drive frame, and the mirror element being suspended from the drive frame asymmetrically relative to the mirror axis of rotation. A method for manufacturing a micromechanical assembly is also described. A method for operating a micromechanical assembly is also described.

27 Claims, 8 Drawing Sheets

(52) U.S. Cl.
CPC ...... *G02B 26/105* (2013.01); *B81B 2201/042* (2013.01); *B81B 2203/0109* (2013.01); *B81B 2203/0154* (2013.01); *B81B 2203/058* (2013.01); *Y10T 29/4902* (2015.01)

(58) Field of Classification Search
CPC ............ G02B 26/0841; G02B 26/0858; G02B 26/105; G02B 7/1821
USPC ......... 359/198.1–199.4, 200.6, 200.8, 221.2, 359/223.1–224.2, 226.1–226.2
See application file for complete search history.

(56) References Cited

U.S. PATENT DOCUMENTS

| | | | |
|---|---|---|---|
| 2003/0117689 A1* | 6/2003 | Helsel | G02B 26/0841 359/292 |
| 2005/0063038 A1* | 3/2005 | Filhol | G02B 26/0858 359/291 |
| 2007/0008401 A1* | 1/2007 | Cannon | G02B 26/0833 347/243 |
| 2009/0059344 A1* | 3/2009 | Marxer | G02B 26/0841 359/290 |
| 2010/0079834 A1* | 4/2010 | Jerman | G02B 26/105 359/199.1 |
| 2011/0194164 A1* | 8/2011 | Chou et al. | 359/200.6 |
| 2012/0218612 A1* | 8/2012 | Chang | G02B 26/0858 359/199.4 |
| 2012/0228460 A1* | 9/2012 | Suzuki | B81B 3/0062 248/474 |
| 2013/0278907 A1* | 10/2013 | Abele et al. | 353/98 |

\* cited by examiner

MICROMECHANICALLY ASSEMBLY, METHOD FOR MANUFACTURING A MICROMECHANICAL ASSEMBLY AND METHOD FOR OPERATING A MICROMECHANICAL ASSEMBLY

CROSS REFERENCE

The present application claims the benefit under 35 U.S.C. §119 of German Patent Application No. DE 102012208117.8 filed on May 15, 2012, which is expressly incorporated herein by reference in its entirety.

FIELD

The present invention relates to a micromechanical assembly. The present invention likewise relates to a method for manufacturing a micromechanical assembly. In addition, the present invention relates to a method for operating a micromechanical assembly.

BACKGROUND INFORMATION

German Patent Application No. DE 10 2008 001 896 A1 describes a micromechanical assembly and a method for manufacturing a micromechanical assembly. A specific embodiment of the micromechanical assembly includes a drive frame, which is joined to a holder via two frame springs, and on which a coil device is formed. The drive frame frames a mirror element which is suspended from the drive frame by two mirror springs. The mirror element is situated between the two mirror springs.

SUMMARY

The asymmetrical suspension of the mirror element from the drive frame relative to the mirror axis of rotation brings about a torque on the mirror element, even in response to a straight motion of the drive frame. Thus, the mirror element is already displaceable about the mirror axis of rotation by setting the drive frame into a straight motion (linear motion). Since it is easier to excite the drive frame into a straight motion than to set the drive frame into a rotational motion about an axis of rotation, the present invention therefore permits a simplified realization of a micromechanical assembly having a swiveling mirror element. As explained in greater detail below, in particular, the mirror element is already able to be set into a resonant rotational motion about the mirror axis of rotation by the linearly oscillating drive frame. Because of the inexpensive and uncomplicated realizability of an actuator device for setting the drive frame into the linearly aligned drive motion, the present invention therefore results in an inexpensive micromechanical assembly requiring little space. In particular, it is possible to dispense with furnishing an actuator device requiring costly electronics for the micromechanical assembly.

The mirror element as total mass, which is suspended from the drive frame by the two mirror springs, advantageously has a center of mass which is set apart from the mirror axis of rotation. Therefore, the asymmetrical suspension of the mirror element relative to the mirror axis of rotation may be understood to mean that the mirror element is suspended in such a way that its mass distribution is asymmetrical relative to the mirror axis of rotation. As explained in greater detail below, the advantageous asymmetrical mass distribution of the mirror element relative to the mirror axis of rotation is feasible in inexpensive and uncomplicated manner.

For example, the mirror element includes a disk-shaped mirror plate having an additional mass disposed on the mirror plate. Preferably, the additional mass is disposed on a back side of the mirror plate directed away from a light-impingement surface of the mirror plate, the additional mass only partially covering the back side. Thus, even if the mirror plate is symmetrical relative to the mirror axis of rotation, the advantageous asymmetry of the mirror element is ensured. However, the formation of the additional mass is not limited to the example described here.

As an alternative, the mirror element may be suspended from the drive frame by the two mirror springs so eccentrically relative to the mirror axis of rotation that a mirror central axis and/or mirror axis of symmetry of the mirror element aligned parallel to the mirror axis of rotation is set apart from the mirror axis of rotation. Thus, even if a formation of an additional mass on the mirror element is omitted, the desired asymmetry of the mirror element relative to the mirror axis of rotation is able to be realized.

In one advantageous specific embodiment, the at least one frame spring is a spiral spring able to be bent into an S-shape. Such a formation of the at least one frame spring facilitates excitation of the drive frame into a straight drive motion/linear motion.

In a further advantageous specific embodiment, a frame central axis and/or frame axis of symmetry of the drive frame aligned parallel to the mirror axis of rotation is set apart from the mirror axis of rotation. This may also be rephrased as an eccentric configuration of the two mirror springs and the mirror element thereby suspended from the drive frame. With the aid of this eccentric placement of the two mirror springs and the mirror element on the drive frame, a torque exerted on the mirror element in response to a straight drive motion of the drive frame is able to be intensified.

As an alternative, the drive frame may be suspended from the holder by two frame springs formed symmetrically relative to a frame-spring axis of symmetry, the mirror axis of rotation being aligned parallel to the frame-spring axis of symmetry and/or lying on the frame-spring axis of symmetry. This may be paraphrased as a rotated suspension of the mirror element in the drive frame. As explained in greater detail below, the position of the axis of rotation, about which the mirror element is able to swivel, relative to its alignment with respect to the drive frame and/or the holder may thus be determined relatively freely.

In one advantageous specific embodiment, at least sub-components of the holder, the drive frame, the at least one frame spring, the first mirror spring, the second mirror spring and the mirror element, respectively, are patterned out of a semiconductor substrate. The micromechanical assembly is thus able to be produced comparatively easily in an advantageously small size. In particular, conventional standard-compliant process steps from semiconductor technology may be used to manufacture the micromechanical assembly.

In one advantageous further refinement, the drive frame, the at least one frame spring, the first mirror spring, the second mirror spring and the mirror element may be encapsulated by at least one first cover plate and one at least partially light-transmitting second cover plate. The first cover plate and/or the second cover plate may be attached to the holder directly or via intermediate layers. Particularly in the case of a frame-shaped holder, each of the two cover plates may be secured directly or indirectly to an upper side or lower side of the holder situated between the inner surfaces and the outside surfaces. Thus, a reliable protection of the encapsulated components of the micromechanical assembly may be realized in an easy manner. In addition, with the aid of the encapsulation, an advantageous underpressure is able to be produced in a spatial area surrounding the mirror element, which means the frictional force to be overcome when adjusting the mirror element is reducible.

Moreover, on the first cover plate, a magnet may be disposed which is framed at least partially by a flux-guide plate bent in a U-shape. As explained in greater detail below, an advantageously high magnetic field may thereby be realized reliably, particularly in a spatial area of the wire sets of the coil device.

The advantages described above are also ensured for a corresponding method for manufacturing a micromechanical assembly.

In addition, the advantages indicated are realizable by execution of a corresponding method for operating a micromechanical assembly.

Preferably, in that context, the mirror element is set into rotational motion, directed about the mirror axis of rotation, in relation to the drive frame by exciting the drive frame to a pure transversal motion as drive motion directed perpendicular to the mirror axis of rotation. Since such an excitation of the drive frame is easily realizable, the mirror element is thus able to be set easily and in controlled fashion into the desired rotational motion, especially into an advantageous, resonant oscillatory motion.

BRIEF DESCRIPTION OF THE DRAWINGS

Further features and advantages of the present invention are explained below with reference to the figures.

DETAILED DESCRIPTION OF EXAMPLE EMBODIMENTS

Figure 1A:
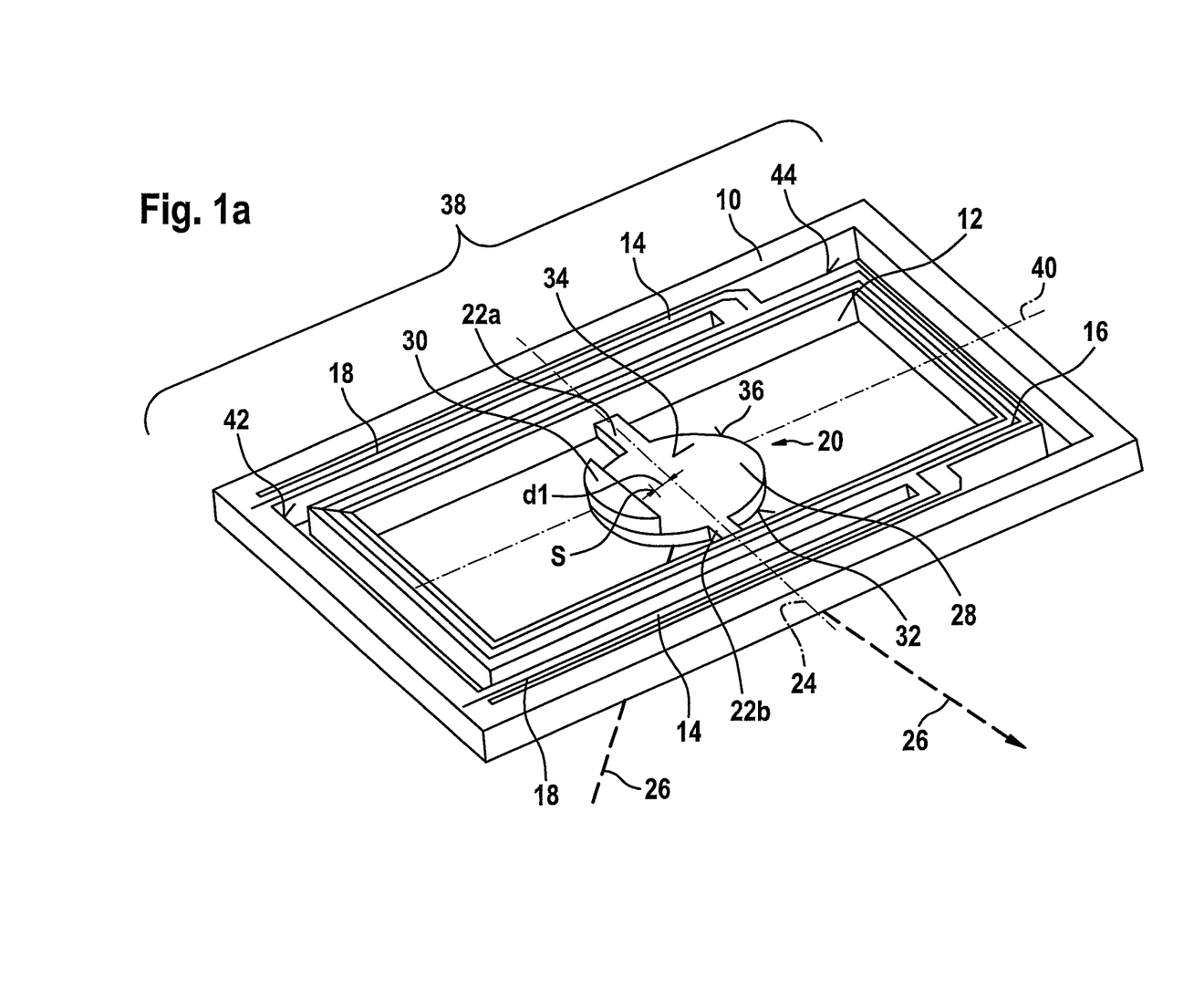
FIGS. 1a and 1b show an oblique view and a top view of a schematic representation of a first specific embodiment of the micromechanical assembly.
Figure 1B:
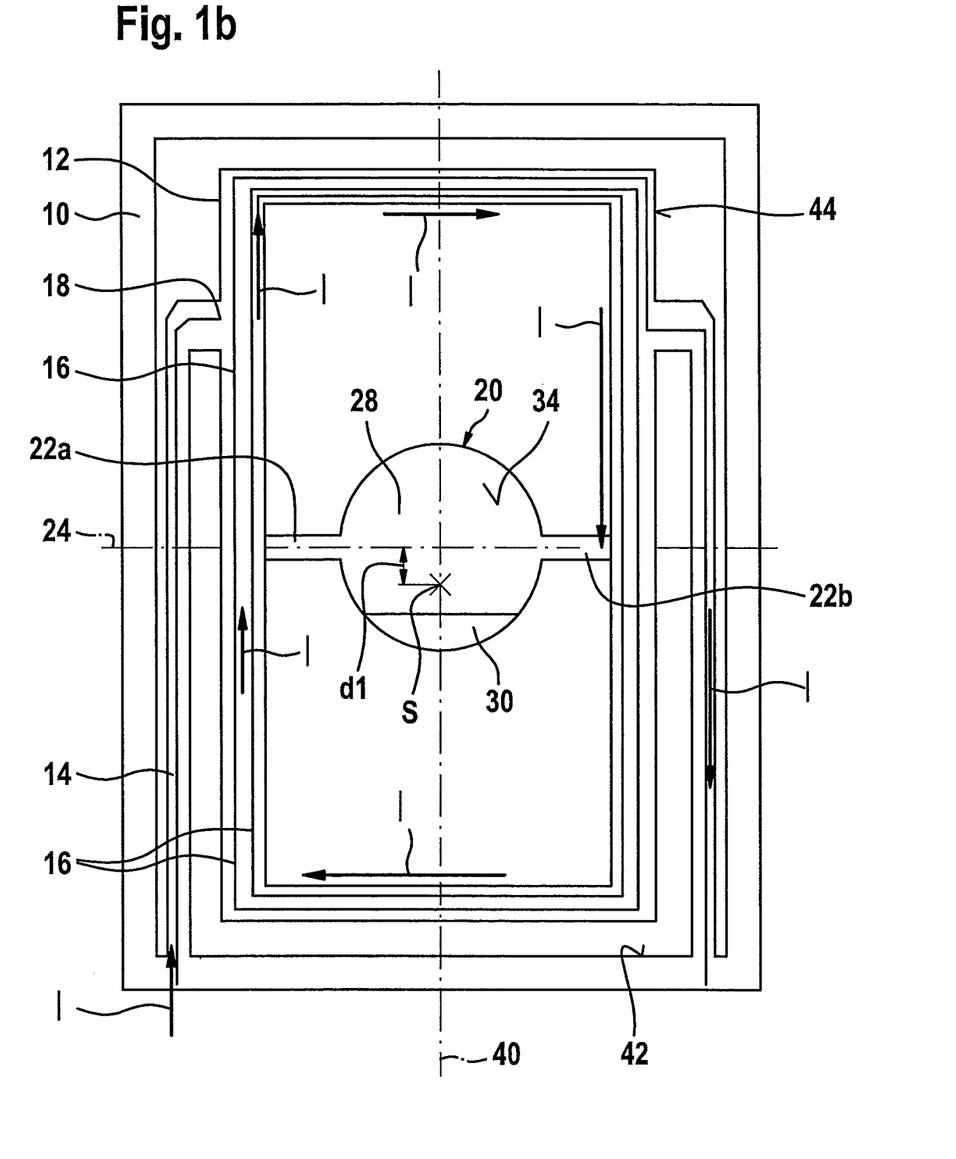

FIGS. 1a and 1b show an oblique view and a top view of a schematic representation of a first specific embodiment of the micromechanical assembly.

The micromechanical assembly represented schematically by FIGS. 1a and 1b includes a holder 10, to which a drive frame 12 is joined via at least one frame spring 14. Drive frame 12 is furnished with at least one energizable coil device 16 situated on and/or in drive frame 12. The energizable construction of coil device 16 may be understood to mean that coil device 16 is connectable via at least two leads 18, which are led via the at least one frame spring 14 and/or overspan a gap situated between drive frame 12 and holder 10, to an external current source in such a way that a current I is able to be conducted through coil device 16. As explained in greater detail below, by energizing coil device 16 given the presence of a magnetic field at coil device 16, a Lorentz force is able to be produced which sets drive frame 12 into a drive motion in relation to holder 10.

The micromechanical assembly also has a mirror element 20 which is at least partially framed by drive frame 12 and is suspended from drive frame 12 by a first mirror spring 22a and a second mirror spring 22b. Each of the two mirror springs 22a and 22b is anchored at its respective first end to drive frame 12, while a second end of respective mirror springs 22a and 22b contact a mirror element 20. The two mirror springs 22a and 22b preferably take the form of torsion springs. However, it should be pointed out that the design possibilities for the two mirror springs 22a and 22b are not limited to a specific form of them.

Mirror element 20 is disposed between the two mirror springs 22a and 22b. The suspension of mirror element 20 with the aid of the two mirror springs 22a and 22b is designed in such a way that mirror element 20 is adjustable about a mirror axis of rotation 24 in relation to drive frame 12. For example, mirror axis of rotation 24 may run through the first ends, anchored to drive frame 12, and the second ends, contacting mirror element 20, of the two mirror springs 22a and 22b. In particular, the two mirror springs 22a and 22b may lie on mirror axis of rotation 24. Thus, in one special development, mirror axis of rotation 24 may also be one common longitudinal axis of the two mirror springs 22a and 22b.

In addition, mirror element 20 is suspended from drive frame 12 asymmetrically relative to mirror axis of rotation 24. The asymmetrical suspension of mirror element 20 relative to mirror axis of rotation 24 may be understood to mean that a mass distribution of mirror element 20, suspended with the aid of mirror springs 22a and 22b, is asymmetrical relative to mirror axis of rotation 24, mirror element 20 preferably to be understood as the total mass suspended from drive frame 12 by the two mirror springs 22a and 22b. Consequently, this may also be rephrased to the effect that mirror element 20 as total mass, which is suspended from drive frame 12 by the two mirror springs 22a and 22b, has a center of mass S which is set apart from mirror axis of rotation 24 (by a distance d1 not equal to zero).

The asymmetrical suspension of mirror element 20 relative to mirror axis of rotation 24 described in the paragraph above produces the advantage that already in response to a straight/linear drive motion of drive frame 12, a torque not equal to zero is exerted upon mirror element 20, by which mirror element 20 is able to be set into a rotational motion about mirror axis of rotation 24. The straight/linear drive motion of drive frame 12 may be understood to be a drive motion aligned perpendicular to mirror axis of rotation 24 and/or a coil-brace surface of drive frame 12. Since such a straight/linear drive motion of drive frame 12 may be brought about easily, mirror element 20 is thus already able to be set into the desired rotational motion about mirror axis of rotation 24 with the aid of an easily executable excitation step.

Thus, the micromechanical assembly described here needs no costly, heavy or large-volume actuator device to set mirror element 20 into the desired rotational motion about mirror axis of rotation 24. In particular, furnishing the micromechanical assembly with costly electronics for controlling the excitation of drive frame 12 may be omitted. In addition, in the micromechanical assembly described here, drive frame 12 may be joined to holder 10 by a comparatively simple connection. Therefore, the micromechanical assembly described may be constructed in a manner that is cost-effective, light and with a comparatively low space requirement.

To excite the advantageous rotational motion of mirror element 20 about mirror axis of rotation 24, drive frame 12 is preferably set into a linear oscillatory motion. With the aid of linearly oscillating drive frame 12, mirror element 20—because of the asymmetrical suspension—may be set reliably into a resonant oscillatory motion. In order to excite drive frame 12 into the desired drive motion, an alternating current with a resonant frequency of the mirror system made up of mirror element 20 and the two mirror springs 22a and 22b may be conducted through coil device 16, so that using a magnet such as the magnet described below, for example, energized coil device 16 undergoes a Lorentz force. The alternating current may be sinusoidal, for instance. It should be pointed out that the resonant frequency of the mirror system made up of mirror element 20 and the two mirror springs 22a and 22b may be set to a preferred value by a suitable selection of the spring constants of mirror springs 22a and 22b, especially by fixing the lengths, heights and/or widths of mirror springs 22a and 22b, as well as by the mass and/or form of mirror element 20. Thus, by a suitable selection of the parameters named here, the resonant frequency of the mirror system made up of mirror element 20 and the two mirror springs 22a and 22b may be set to a preferred value. The resonant frequency of drive frame 12 and of the at least one frame spring 14 may likewise be established by their masses and/or forms, the resonant frequency of drive frame 12 and of the at least one frame spring 14 preferably lying in the range of the mirror resonant frequency or (considerably) below.

Because of the good adjustability of mirror element 20 about mirror axis of rotation 24, a light beam 26 is already able to be deviated amply by a comparatively small adjustment movement of mirror element 20. In addition, due to the advantageous adjustability of mirror element 20 about mirror axis of rotation 24 by the excitation of drive frame 12 into the at least partially linearly oriented drive motion, comparatively large adjustment angles may be realized about mirror axis of rotation 24. Therefore, the micromechanical assembly described here is suitable advantageously for use in a projector and/or in a scanner.

In the specific embodiment shown schematically in FIGS. 1a and 1b, mirror element 20 (as total mass suspended from drive frame 12 by the two mirror springs 22a and 22b) includes a disk-shaped mirror plate 28 with an additional mass 30 disposed on mirror plate 28. (Disk-shaped mirror plate 28 may be understood to be a mirror plate 28 having a constant height perpendicular to mirror axis of rotation 24 and/or to a light-impingement surface 32.) Preferably, additional mass 30 is applied in such a way on a back side 34 directed away from light-impingement surface 32 of mirror plate 28, that at least a partial surface of back side 34 of mirror plate 28 remains uncovered by additional mass 30. In particular, additional mass 30 may be asymmetrical relative to mirror axis of rotation 24, while mirror plate 28 exhibits a symmetry relative to mirror axis of rotation 24. Instead of forming additional mass 30 on back side 34, additional mass 30 may also be applied on a side with light-impingement surface 32 and/or at an outer-edge area 36 of mirror plate 28.

In addition, FIGS. 1a and 1b show a specific embodiment in which at least sub-components of holder 10, drive frame 12, the at least one frame spring 14, first mirror spring 22a, second mirror spring 22b and mirror element 20, respectively, are patterned out of a semiconductor substrate 38. For example, semiconductor substrate 38 may be a silicon substrate.

In order to form an electrical insulation on the sub-component of drive frame 12 patterned out of semiconductor substrate 38, a thin oxide layer may be formed. For instance, this may be accomplished via thermal oxidation. Subsequently, at least one conductive material such as aluminum and/or copper may be deposited on the thin oxide layer and patterned into the desired form of coil device 16. In addition to that, a bridging and/or at least one buried printed circuit trace may be formed in drive frame 12, as well.

In order to place additional mass 30 on mirror element 20, after mirror plate 28 has been patterned out, a further material may be deposited on it. Reflectivity of light-impingement surface 32 may be increased by a deposited reflective material and/or by polishing light-impingement surface 32.

In addition, mirror element 20 may be hollowed out on its back side 34 in order to increase the resonant frequency or to reduce a loading of the at least one mirror spring. A deformation of mirror element 20 during the execution of a rotational motion about mirror axis of rotation 24 may also be decreased in this manner.

Mirror element 20 may also be lifted out from the level/plane of mirror springs 22a and 22b. The space thereby becoming free below spring element 20 may be used for an extension of the at least one mirror spring 22a and 22b.

Each of mirror springs 22a and 22b may also have at least one snaking, that is, may be meander-shaped. Because the flexural stiffness of mirror springs 22a and 22b is reducible in this manner, relatively great excursions of mirror element 20 about mirror axis of rotation 24 may be attained. In addition, a (mechanical) loading of the material of mirror springs 22a and 22b during the rotational motion of mirror element 20 about mirror axis of rotation 24 is thereby reducible.

Preferably, holder 10 takes the form of a fixable outer frame. As described in greater detail below, this facilitates encapsulation of components 12, 14, 20, 22a and 22b of the micromechanical assembly situated within the outer frame. For example, the at least one frame spring 14 may be a spiral spring bendable into an S-shape. This permits good adjustability of drive frame 12 into a direction aligned perpendicular to drive frame 12 and/or mirror axis of rotation 24, in relation to holder 10. However, the design possibilities for the at least one frame spring 14 are not limited to this spring form. Preferably, drive frame 12 is suspended from holder 10 by two frame springs 14, the two frame springs 14 preferably being formed symmetrically relative to a frame-spring axis of symmetry 40. In particular, frame-spring axis of symmetry 40 may run centrally through holder 10, drive frame 12 and/or mirror element 20.

The specific embodiment in FIGS. 1a and 1b also shows a formation of the at least one frame spring 14, in which the at least one frame spring 14 is anchored to a side 42 of holder 10 aligned parallel to mirror axis of rotation 24, and contacts a side 44 of drive frame 12 aligned perpendicular to mirror axis of rotation 24. In this way, the at least one frame spring 14 may be formed to be comparatively long, although the total gap volume of the gap between holder 10 and drive frame 12 is relatively small. The advantageous great length of the at least one frame spring 14 reliably ensures the preferred low flexural stiffness of the at least one frame spring 14.

Figure 2:
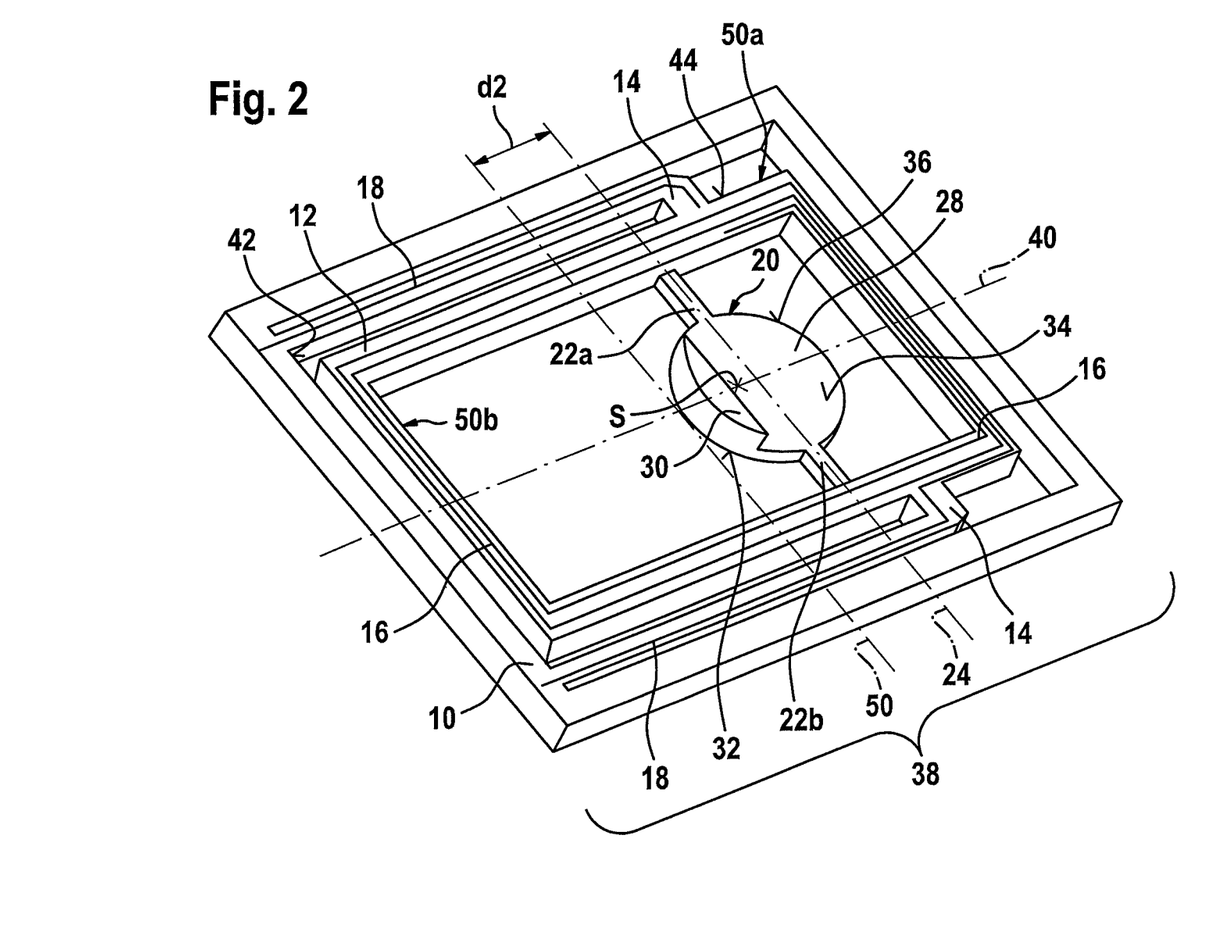
FIG. 2 shows an oblique view of a schematic representation of a second specific embodiment of the micromechanical assembly.

FIG. 2 shows an oblique view of a schematic representation of a second specific embodiment of the micromechanical assembly.

The micromechanical assembly represented schematically in FIG. 2 has the components already described above. As addition to that, in the case of the micromechanical assembly in FIG. 2, mirror element 20 is suspended from drive frame 12 by the two mirror springs 22a and 22b in such a way that a frame central axis 50 and/or frame axis of symmetry of drive frame 12 aligned parallel to mirror axis of rotation 24 is set apart from mirror axis of rotation 24 (by a distance d2 not equal to zero). Frame central axis 50 and/or frame axis of symmetry of drive frame 12 may be understood to be an axis which intersects drive frame 12 centrally and/or relative to which, drive frame 12 is formed symmetrically. In that context, one may also speak of a suspension of mirror element 20 which is offset relative to a center of drive frame 12. In this manner, the torque exerted on mirror element 20 by the preferably linearly oriented drive motion of drive member 12 may be increased. This leads to improved adjustability of mirror element 20 about mirror axis of rotation 24, especially in the case of large deflection angles of mirror element 20.

Frame central axis 50 and/or the frame axis of symmetry subdivides drive frame 12 into a first half 50a, on which the at least one frame spring 14 is anchored to drive frame 12, and into a second half 50b. In the specific embodiment shown in FIG. 2, both mirror springs 22a and 22b contact drive frame 12 on first half 50a of drive frame 12.

Figure 3:
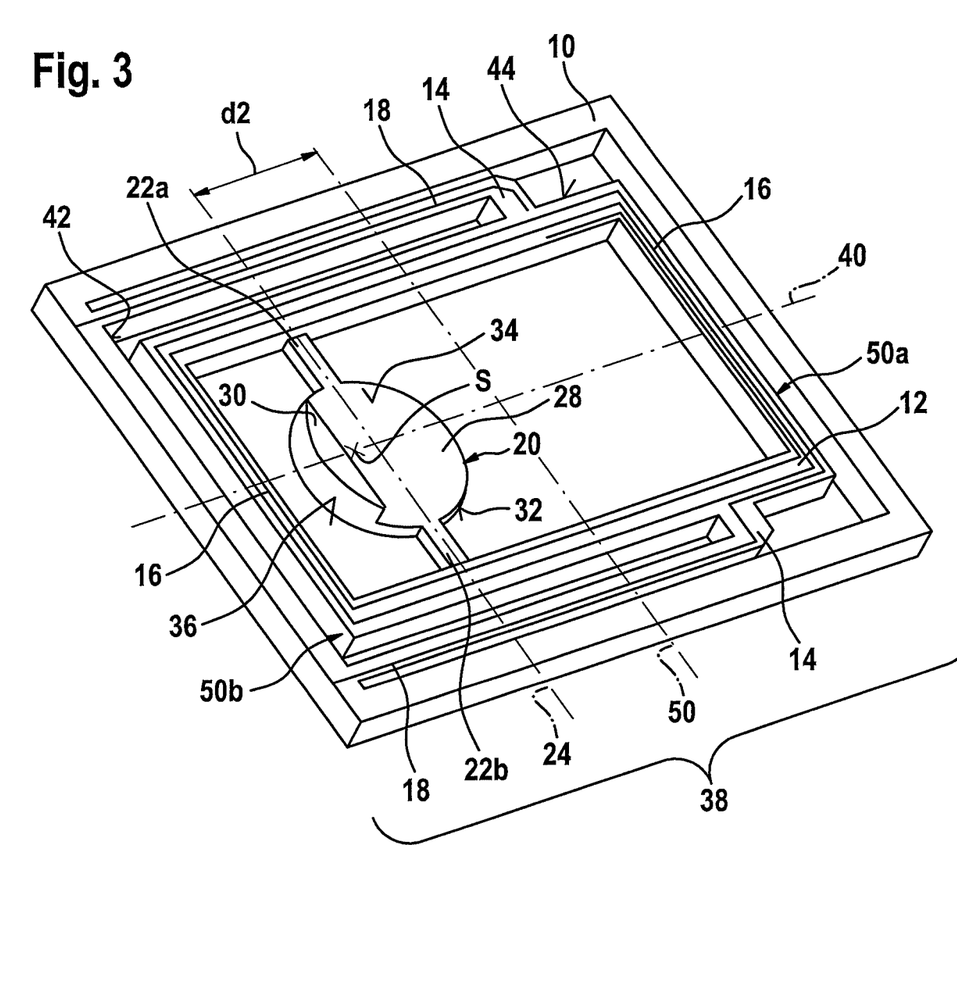
FIG. 3 shows an oblique view of a schematic representation of a third specific embodiment of the micromechanical assembly.

FIG. 3 shows an oblique view of a schematic representation of a third specific embodiment of the micromechanical assembly.

In the specific embodiment in FIG. 3, frame central axis 50 and/or the frame axis of symmetry of drive frame 12 aligned parallel to the mirror axis of rotation is also set apart from mirror axis of rotation 24 (by distance d2 not equal to zero). However, in the specific embodiment in FIG. 3, both mirror springs 22a and 22b are anchored to second half 50b of drive frame 12, while the at least one frame spring 14 contacts drive frame 12 on its first half 50a.

Figure 4:
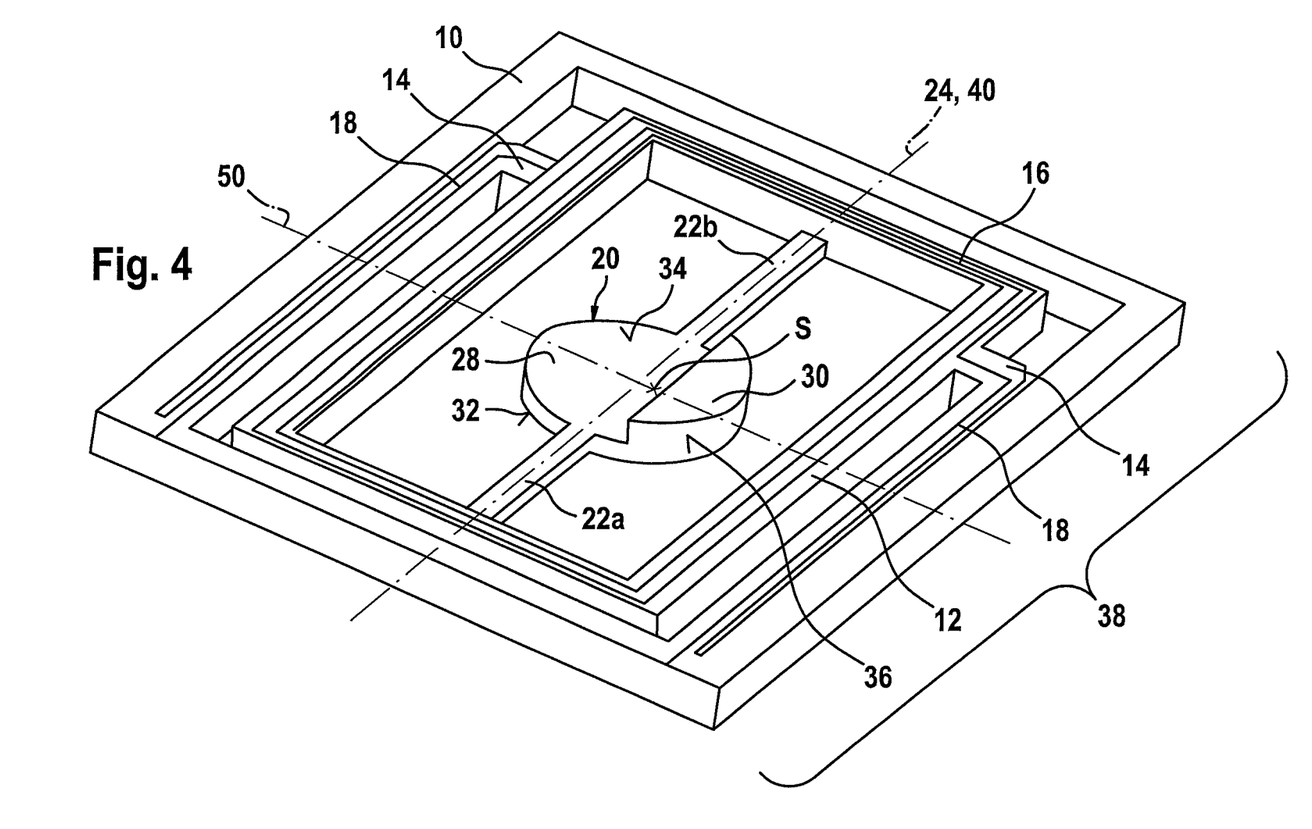
FIG. 4 shows an oblique view of a schematic representation of a fourth specific embodiment of the micromechanical assembly.

FIG. 4 shows an oblique view of a schematic representation of a fourth specific embodiment of the micromechanical assembly.

In comparison to the specific embodiments previously described, in the specific embodiment represented schematically in FIG. 4, the suspension of the mirror is rotated by 90°. This may also be rephrased to the effect that mirror axis of rotation 24 is aligned parallel to frame-spring axis of symmetry 40 and/or lies on frame-spring axis of symmetry 40. It should be pointed out that for mirror axis of rotation 24, an alignment is also realizable in which mirror axis of rotation 24 is inclined both by a first angle of inclination not equal to 0° and not equal to 90° relative to frame-spring axis of symmetry 40, and by a second angle of inclination not equal to 0° and not equal to 90° relative to frame central axis 50 and/or the frame axis of symmetry aligned perpendicular to it. The first angle of inclination may be between 0° and 90°. For example, the first angle of inclination and the second angle of inclination may each be 45°.

Figure 5:
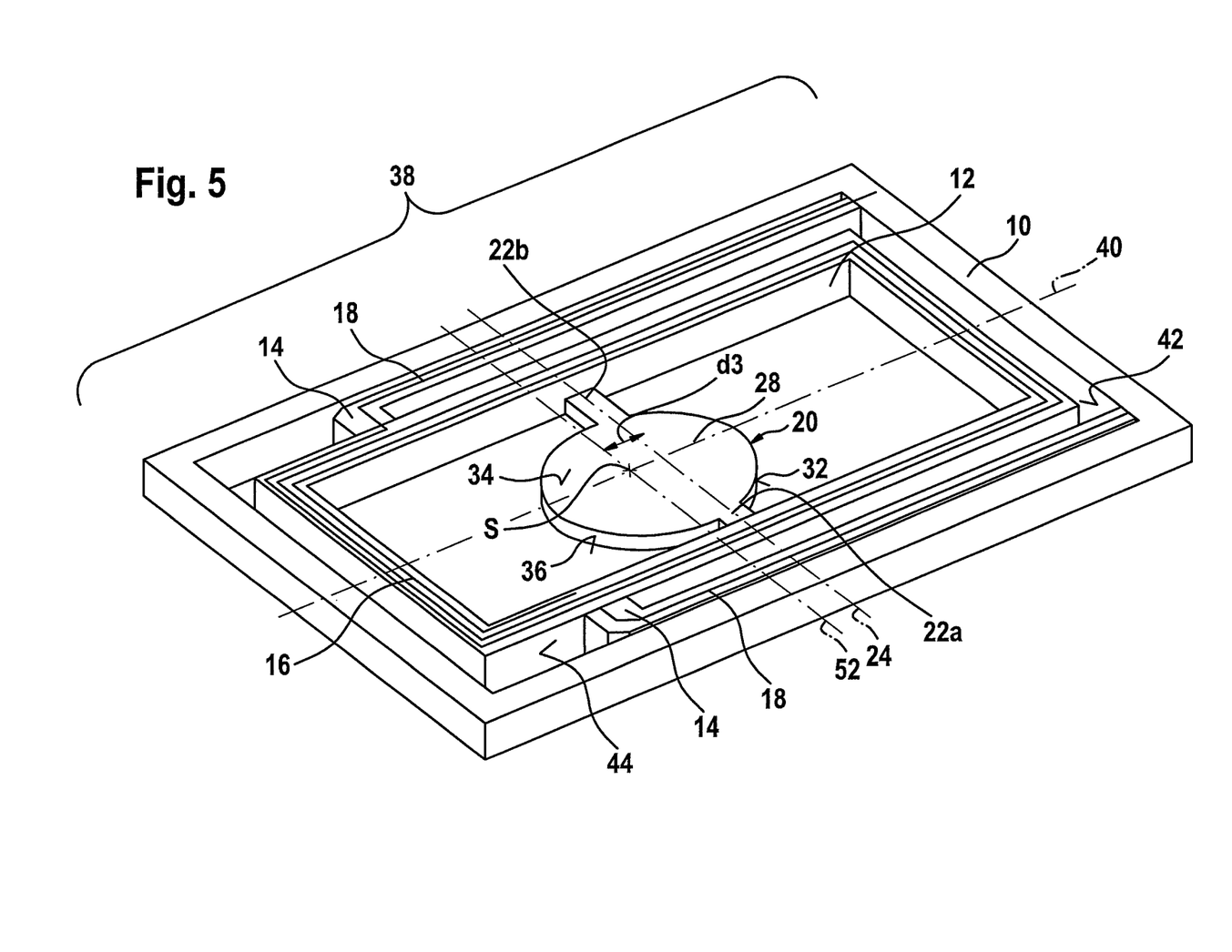
FIG. 5 shows an oblique view of a schematic representation of a fifth specific embodiment of the micromechanical assembly.

FIG. 5 shows an oblique view of a schematic representation of a fifth specific embodiment of the micromechanical assembly.

In the specific embodiment in FIG. 5, the asymmetry of the suspension of mirror element 20 relative to mirror axis of rotation 24 is realized by suspending mirror element 20 with the aid of the two mirror springs 22a and 22b from drive frame 12 eccentrically relative to mirror axis of rotation 24. This is ensured provided a mirror central axis 52 and/or mirror axis of symmetry of mirror element 20 aligned parallel to mirror axis of rotation 24 is set apart from mirror axis of rotation 24 (by a distance d3 not equal to zero). Thus, the desired asymmetrical suspension of mirror element 20 is realizable even given a formation of mirror element 20 exclusively as a mirror plate 28 having a constant height perpendicular to mirror axis of rotation 24 (without an additional mass). With the aid of the eccentric suspension of mirror element 20 represented in FIG. 5, a torque is also able to be induced upon mirror element 20 in response to a linear drive motion of drive frame 12. Thus, the specific embodiment in FIG. 5 also fulfills the advantages already articulated above.

Figure 6A:
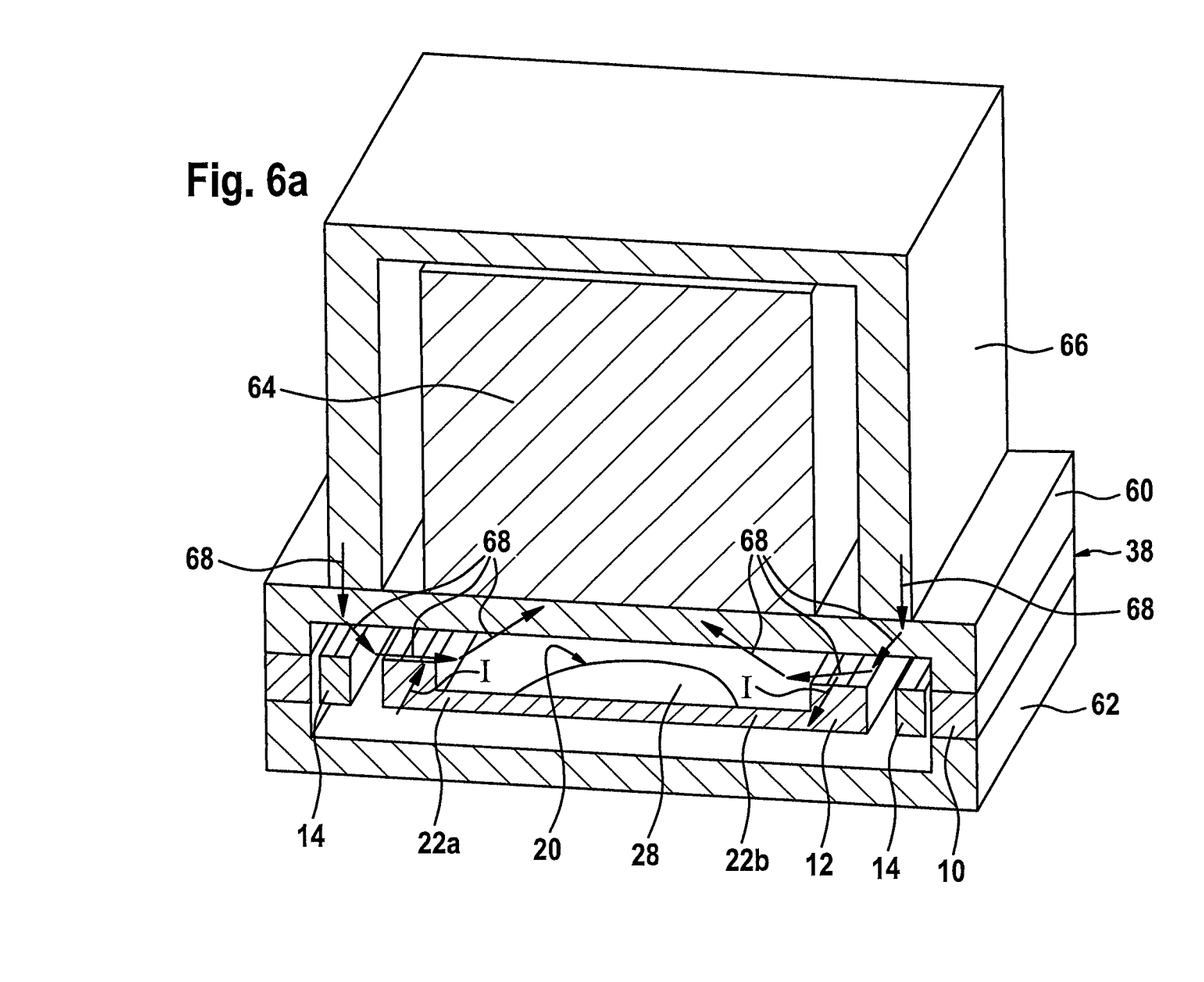
FIGS. 6a and 6b show a cross section and an oblique view of a schematic representation of a sixth specific embodiment of the micromechanical assembly.
Figure 6B:
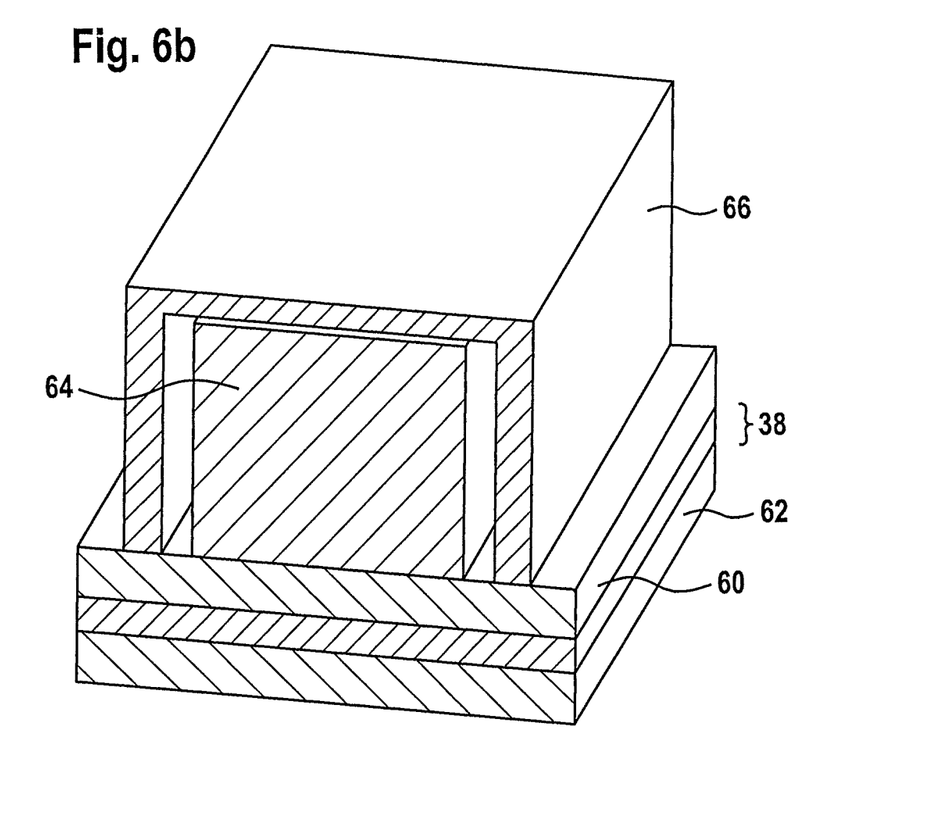

FIGS. 6a and 6B show a cross section and an oblique view of a schematic representation of a sixth specific embodiment of the micromechanical assembly.

The micromechanical assembly represented schematically in FIGS. 6a and 6b may be a further refinement of the specific embodiments explained above. In the case of the micromechanical assembly in FIGS. 6a and 6b, drive frame 12, the at least one frame spring 14, first mirror spring 22a, second mirror spring 22b and mirror element 20 are encapsulated by at least one first cover plate 60 and one at least partially light-transmitting, second cover plate 62. To that end, cover plates 60 and 62 may be attached directly to holder 10 and/or via an intermediate layer. Particularly if holder 10 is formed as an outer frame, cover plates 60 and 62 are able to be secured in a simple manner to holder 10. Preferably, cover plates 60 and 62 are first provided beforehand with a hollowing-out and subsequently secured to two opposite sides of holder 10 in such a way that each of the two cover plates 60 and 62 overspans components 12, 14, 20, 22a and 22b of the micromechanical assembly. The formation of a hollowing-out on cover plates 60 and 62 makes it possible to ensure reliably that the micromechanical assembly has sufficient free space even after the encapsulation, so that components 12, 14, 20, 22a and 22b of the micromechanical assembly are movable. To secure the two cover plates 60 and 62 reliably, they may be fixedly bonded to holder 10, for example. (Cover plates 60 and 62 may also be defined as caps.)

The encapsulation of substrate 38 by the two cover plates 60 and 62 described above ensures advantageous protection against contamination and/or penetration of liquids. In addition, by the encapsulation of semiconductor substrate 38 described here, an underpressure may be adjusted in a spatial area surrounding components 12, 14, 20, 22a and 22b of the micromechanical assembly. In this way, it is ensurable that only a comparatively small frictional force counteracts a desired movement of components 12, 14, 20, 22a and 22b of the micromechanical assembly.

It should be pointed out that all specific embodiments of the micromechanical assembly patterned out of semiconductor substrate 38 described above may be encapsulated in the manner described here. However, the micromechanical assembly represented by FIGS. 6a and 6b is not limited to an application of the specific embodiments of semiconductor substrate 38 described above.

As a further refinement, in the specific embodiment of FIGS. 6a and 6b, a magnet 64 is disposed on first cover plate 60, the magnet being framed at least partially (on its lateral surfaces not covered by first cover plate 60) by a flux-guide plate 66 bent in a U-shape. With the aid of flux-guide plate 66, magnetic field 68 (permanent magnetic field) of magnet 64 may be aligned in such a way that, above all, a relatively high magnetic-field strength exists in the area of the wire sets of coil device 16 aligned perpendicular to mirror axis of rotation 24. Thus, even in the event of a comparatively low current flow I through coil device 16, a relatively great Lorentz force is able to be brought about. This ensures good excitability of drive frame 12 into the desired drive motion, with at least one motion component aligned perpendicular to mirror axis of rotation 24. The advantageous provision of magnet 64 with flux-guide plate 66 described here consequently results in good adjustability of mirror element 20 about mirror axis of rotation 24, in spite of the comparatively low current consumption.

The advantageous method for manufacturing a micromechanical assembly is represented schematically on the basis of the specific embodiments described above. Therefore, a more detailed description of the manufacturing method is dispensed with here.

Figure 7:
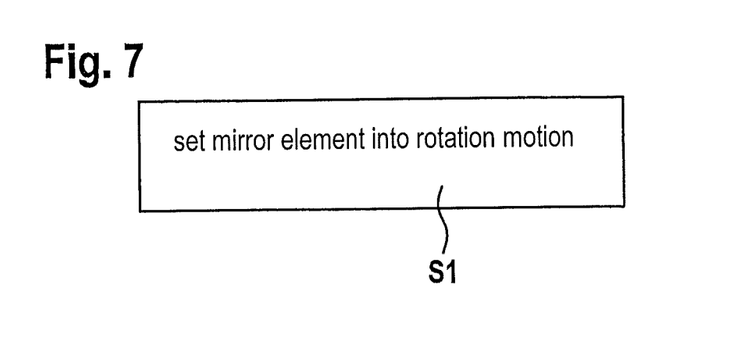
FIG. 7 shows a flow chart for explaining a specific embodiment of the method for operating a micromechanical assembly.

FIG. 7 shows a flow chart for explaining a specific embodiment of the method for operating a micromechanical assembly.

The method is executable with the aid of a micromechanical assembly having a holder, a drive frame which is joined to the holder via at least one frame spring, and a mirror element which is at least partially framed by the drive frame and is suspended from the drive frame by a first mirror spring and a second mirror spring, the mirror element being disposed between the two mirror springs, and the mirror element being suspended from the drive frame asymmetrically relative to a mirror axis of rotation. For example, one of the specific embodiments described above may be utilized to carry out the method for operating the micromechanical assembly. However, the realizability of the method is not limited to the use of such a micromechanical assembly.

The example method has one method step S1, in which the mirror element is set into a rotational motion directed about the mirror axis of rotation, by setting the drive frame into a drive motion having at least one motion component directed perpendicular to the mirror axis of rotation. In particular, the mirror element may be set into the rotational motion about the mirror axis of rotation by exciting the drive frame to a pure transversal motion as drive motion directed perpendicular to the mirror axis of rotation.

The method ensures the advantages already described above, which are not articulated again here.

What is claimed is:

1. A micromechanical assembly comprising:
    a holder;
    a drive frame which has at least one energizable coil device disposed at least one of on and in the drive frame, and which is joined to the holder via at least one frame spring, the at least one frame spring configured to bend so that an entire end of the at least one frame spring connected to the drive frame moves, in response to a drive force, with a drive motion having a component perpendicular to a mirror axis of rotation of a mirror element; and
    the mirror element, at least partially framed by the drive frame, the mirror element being suspended from the drive frame by a first mirror spring and a second mirror spring, the mirror element being disposed between the first mirror spring and the second mirror spring and being adjustable about the mirror axis of rotation in relation to the drive frame, wherein the mirror element is suspended from the drive frame asymmetrically relative to the mirror axis of rotation.

2. The micromechanical assembly as recited in claim 1, wherein the mirror element has a center of mass which is set apart from the mirror axis of rotation.

3. The micromechanical assembly as recited in claim 1, wherein the mirror element includes a disk-shaped mirror plate with an additional mass disposed on the mirror plate asymmetrically relative to the mirror axis of rotation.

4. The micromechanical assembly as recited in claim 1, wherein the mirror element is suspended from the drive frame by the two mirror springs eccentrically relative to the mirror axis of rotation so that at least one of a mirror central axis and mirror axis of symmetry of the mirror element aligned parallel to the mirror axis of rotation is set apart from the mirror axis of rotation.

5. The micromechanical assembly as recited in claim 1, wherein the at least one frame spring is a spiral spring able to be bent into an S-shape.

6. The micromechanical assembly as recited in claim 1, wherein at least one of: a frame central axis and frame axis of symmetry of the drive frame aligned parallel to the mirror axis of rotation, is set apart from the mirror axis of rotation.

7. The micromechanical assembly as recited in claim 1, wherein the drive frame is suspended from the holder by two frame springs formed symmetrically relative to a frame-spring axis of symmetry, and the mirror axis of rotation is at least one of aligned parallel to the frame-spring axis of symmetry, and lies on the frame-spring axis of symmetry.

8. The micromechanical assembly as recited in claim 1, wherein at least sub-components of the holder, the drive frame, the at least one frame spring, the first mirror spring, the second mirror spring and the mirror element are patterned out of a semiconductor substrate.

9. The micromechanical assembly as recited in claim 8, wherein the drive frame, the at least one frame spring, the first mirror spring, the second mirror spring and the mirror element are encapsulated by at least one first cover plate and one at least partially light-transmitting second cover plate.

10. The micromechanical assembly as recited in claim 9, wherein on the first cover plate, a magnet is disposed which is framed at least partially by a flux-guide plate bent in a U-shape.

11. The micromechanical assembly as recited in claim 1, wherein the drive frame is configured to move in a substantially linear motion in response to an alternating current being conducted in the coil device in the presence of a magnet.

12. The micromechanical assembly as recited in claim 1, wherein the at least one frame spring is configured so that a second end connected to the holder remains in a substantially fixed position while the second end moves with the drive motion.

13. The micromechanical assembly as recited in claim 1, wherein the drive force is a substantially linear drive force.

14. The micromechanical assembly as recited in claim 1, wherein the drive frame is configured to move with a drive motion having at least one motion component perpendicular to a plane defined by the holder.

15. A method for manufacturing a micromechanical assembly, comprising:
    suspending a drive frame, having at least one energizable coil device disposed at least one of on and in the drive frame, from a holder with the aid of at least one frame spring, the at least one frame spring configured to bend so that an entire end of the at least one frame spring connected to the drive frame moves, in response to a drive force, with a drive motion having a component perpendicular to a mirror axis of rotation of a mirror element; and suspending the mirror element from the drive frame by a first mirror spring and a second mirror spring in such a way that the mirror element is at least partially framed by the drive frame and is situated between the first mirror spring and the second mirror spring, wherein the mirror element is suspended from the drive frame asymmetrically relative to the mirror axis of rotation, about which the mirror element is adjusted in relation to the drive frame with the aid of a drive motion of the drive frame upon operation of the micromechanical assembly.

16. The method as recited in claim 15, wherein the mirror element has a center of mass which is set apart from the mirror axis of rotation.

17. The method as recited in claim 15, wherein the mirror element includes a mirror plate with an additional mass disposed on the mirror plate asymmetrically relative to the mirror axis of rotation.

18. A method for operating a micromechanical assembly having a holder, a drive frame which is joined to the holder via at least one frame spring, and a mirror element that is at least partially framed by the drive frame and is suspended from the drive frame by a first mirror spring and a second mirror spring, the mirror element being disposed between the first mirror spring and the second mirror spring, and the mirror element being suspended from the drive frame asymmetrically relative to a mirror axis of rotation, the method comprising:

setting the mirror element into a rotational motion, directed about the mirror axis of rotation, in relation to the drive frame, by applying a drive force to set the entire drive frame into a drive motion substantially perpendicular to the mirror axis of rotation, wherein applying the drive force causes an entire end of the at least one frame spring connected to the drive frame to move with the drive motion substantially perpendicular to the mirror axis of rotation of the mirror element.

19. The method as recited in claim 18, wherein the mirror element is set into the rotational motion, directed about the mirror axis of rotation, in relation to the drive frame by exciting the drive frame to a pure transversal motion as the drive motion substantially perpendicular to the mirror axis of rotation.

20. The method as recited in claim 18, wherein the mirror element has a center of mass which is set apart from the mirror axis of rotation.

21. The method as recited in claim 18, wherein the mirror element includes a mirror plate with an additional mass disposed on the mirror plate asymmetrically relative to the mirror axis of rotation.

22. A micromechanical assembly, comprising:
a holder;
a drive frame having at least one energizable coil device and which is joined to the holder via at least one frame spring, the at least one frame spring configured to bend so that the entire drive frame moves in response to a drive force with a drive motion substantially perpendicular to a mirror axis of rotation of a mirror element; and the mirror element, suspended from the drive frame by a plurality of mirror springs and being rotatable about the mirror axis of rotation in relation to the drive frame, wherein the mirror element is suspended from the drive frame asymmetrically relative to the mirror axis of rotation, wherein the at least one frame spring is configured to bend so that an entire end of the at least one frame spring moves in response to the drive force with the drive motion substantially perpendicular to the mirror axis of rotation.

23. The micromechanical assembly as recited in claim 22, wherein the mirror element has a center of mass which is set apart from the mirror axis of rotation.

24. The micromechanical assembly as recited in claim 22, wherein the mirror element includes a mirror plate with an additional mass disposed on the mirror plate asymmetrically relative to the mirror axis of rotation.

25. A method for operating a micromechanical assembly having a holder, a drive frame which has at least one energizable coil device disposed at least one of on and in the drive frame and which is joined to the holder via at least one frame spring configured to bend, and a mirror element which is at least partially framed by the drive frame and is suspended from the drive frame by a first mirror spring and a second mirror spring, the mirror element being disposed between the first mirror spring and the second mirror spring and being adjustable about a mirror axis of rotation in relation to the drive frame, wherein the mirror element is suspended from the drive frame asymmetrically relative to the mirror axis of rotation, the method comprising:

setting the mirror element into a rotational motion, directed about the mirror axis of rotation, in relation to the drive frame, by applying a drive force so that an entire end of the at least one frame spring connected to the drive frame moves with a drive motion having a component perpendicular to the mirror axis of rotation of the mirror element.

26. The method as recited in claim 12, wherein the mirror element has a center of mass which is set apart from the mirror axis of rotation.

27. The method as recited in claim 12, wherein the mirror element includes a mirror plate with an additional mass disposed on the mirror plate asymmetrically relative to the mirror axis of rotation.

* * * * *